United States Patent [19]

Armacost et al.

[11] Patent Number: 5,545,581

[45] Date of Patent: Aug. 13, 1996

[54] PLUG STRAP PROCESS UTILIZING SELECTIVE NITRIDE AND OXIDE ETCHES

[75] Inventors: Michael D. Armacost, Wallkill, N.Y.; John H. Givens, Essex Junction, Vt.; Charles W. Koburger, III, Essex Junction, Vt.; Jerome B. Lasky, Essex Junction, Vt.

[73] Assignee: International Business Machines Corporation, Armonk, N.Y.

[21] Appl. No.: 350,445

[22] Filed: Dec. 6, 1994

[51] Int. Cl.[6] ............................................. H01L 21/8242
[52] U.S. Cl. .............................. 437/52; 437/60; 437/228
[58] Field of Search ................................ 437/47, 52, 60, 437/919, 228, 235, 238, 241; 156/643; 216/72, 79, 99

[56] References Cited

U.S. PATENT DOCUMENTS

| | | | |
|---|---|---|---|
| 4,466,172 | 8/1984 | Batra | 437/60 |
| 4,541,168 | 9/1985 | Galie et al. | 29/579 |
| 4,801,988 | 1/1989 | Kenney | 357/23.6 |
| 4,870,470 | 9/1989 | Bass, Jr. et al. | 357/23.5 |
| 4,962,058 | 10/1990 | Cronin et al. | 437/187 |
| 4,983,544 | 1/1991 | Lu et al. | 437/200 |
| 5,065,273 | 11/1991 | Rajeevakumar | 361/313 |
| 5,089,865 | 2/1992 | Mitsui et al. | 357/23.4 |
| 5,126,280 | 6/1992 | Chan et al. | 437/52 |
| 5,151,376 | 9/1992 | Spinner, III | 437/52 |
| 5,200,354 | 4/1993 | Om et al. | 437/52 |
| 5,270,237 | 12/1993 | Sang et al. | 437/52 |
| 5,293,512 | 3/1994 | Nishigoori et al. | 257/622 |
| 5,362,666 | 11/1994 | Dennison | 437/52 |
| 5,380,674 | 1/1995 | Icimura et al. | 437/52 |

OTHER PUBLICATIONS

J. Givens et al., "Selective Dry Etching in a High Density Plasma for 0.5 μm Complimentary Metal–oxide–semiconductor Technology" J. Vac. Sci. Tehnol. B 12 (1) Jan./Feb. 1994 pp. 427–432.

Kuesters et al. "Self–aligned Bitline Contact for 4 MBIT DRAM." ULSI Science & Technology /1987 pp.–40–49.

*Primary Examiner*—Tom Thomas
*Attorney, Agent, or Firm*—Heslin & Rothenberg, P.C.

[57] ABSTRACT

The invention provides a method for electrically connecting a trench capacitor and a diffusion region, and also for electrically connecting a trench capacitor or a diffusion region with external circuitry in a semiconductor device. The method provides for formation of a strap or bridge contact by formation of strap holes exposing the electrical elements utilizing an oxide insulation layer and a nitride etch stop and a highly selective oxide:nitride etch and a selective nitride:oxide etch. The strap holes may then be filled with an electrical conductor.

31 Claims, 7 Drawing Sheets

PLUG STRAP PROCESS UTILIZING SELECTIVE NITRIDE AND OXIDE ETCHES

TECHNICAL FIELD

The present invention relates to strap formation in a semiconductor device, and more particularly to formation of a plug strap to electrically connect two electronic elements in a semiconductor device, separated by a dielectric, utilizing highly selective oxide and nitride etches.

BACKGROUND

Semiconductor devices typically have large numbers of electronic elements which need to be interconnected in order for the device to function. These electrical elements can be interconnected by forming a "bridge contact" or "strap" between the structures.

Prior attempts to form straps to electrically connect polysilicon trenches and diffusion regions separated by a dielectric included depositing conductive polysilicon, such as boron doped silicon, after the formation of implants within the diffusion regions. The polysilicon layer is then etched to define the material as a "strap" in order to electrically connect the diffusion and the polysilicon trench. However, this process experiences significant problems, many relating to the fact that the polysilicon etchant would often get beneath the implants or $TiSi_x$ and etch holes in the underlying silicon thereby causing leakage in the resulting semiconductor device. In order to avoid such problems more complex processes were devised in which formation of a strap was constructed utilizing the out-diffusion of boron. The exposed silicon areas of the polysilicon trench and diffusion region are doped with boron using ion implantation. A diffusion barrier is then applied over the doped areas, masked and etched to remove selected areas of the barrier. A continuous layer of polysilicon is deposited and boron is out-diffused into the polysilicon upon the highly doped areas. Wet etches are then utilized to remove those portions of the continuous layer of polysilicon which do not contain the diffused boron dopant; another etch also removes the diffusion barrier. The residual doped polysilicon forms an electrical connection between the polysilicon trench and the diffusion region.

The few reliable methods currently available for the formation of bridge contacts or straps involve complex processing sequences and significant cycle-time. In addition, due to the wide array of steps incorporated within such methods it is often difficult to fully integrate them into the processing sequence without experiencing problems. For example, the thermal budget of the integrated process often involves masking and etching steps which cause voiding in the polysilicon and lifting of the polycide in the gate stack. Such potential problems could be eliminated or reduced by utilizing a process having a shorter cycle-time, fewer steps and, more importantly, incorporating standard processing steps and materials.

In addition, in order to protect existing structures, present processes often require the use of a thick oxide cap on gate stacks. Unfortunately, however, the thicker the oxide cap, the more bias related problems associated with the device. Conversely, reducing the thickness of the oxide cap and, thus, height of the gate stack reduces bias related problems and improves line width control.

It is therefore an object of the present invention to provide a method for electrically connecting two electronic elements of a semiconductor device separated by a dielectric which incorporates standard processing techniques and materials. It is a further object of the present invention to provide such a method which is more efficient, having fewer processing steps and a shorter cycle-time. It is a further object to reduce bias related problems and improve line width control of the resulting devices. It is a further object of the present invention to create a more reliable semiconductor device by forming the strap without damaging electrical components and thereby preventing leakage, shorts, and other potential defects.

DESCRIPTION OF THE INVENTION

Figure 1:
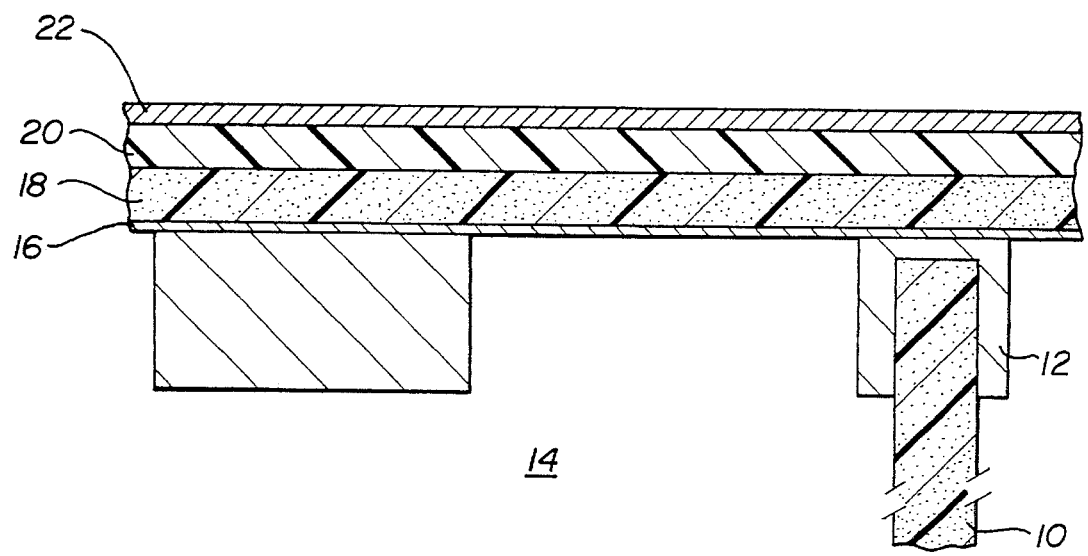
FIG. 1 is a cross sectional view of a semiconductor device having a polysilicon trench and an isolation trench within the silicon substrate and a plurality of layers thereon.

As used in the subject invention, etching refers to chemically eating away a material to form a desired pattern. Selectively etching refers to the use of etching to remove selected portions of one material from another in a semiconductor structure. Selective oxide:nitride etch refers to an etch having a higher etch rate for oxide than for nitride; the selectivity ratio of which indicates the relative etch rates of the respective materials. A highly selective oxide:nitride etch refers to a selective oxide:nitride etch having a selectivity ratio of at least 12:1.

Silicon, as used in this application, includes polysilicon (polycrystalline silicon), amorphous silicon (non-crystalline silicon), monocrystalline silicon and silicon/germanium materials. Such silicon may be n- or p-doped, or undoped.

CVD refers to chemical vapor deposition. LPCVD refers to low pressure chemical vapor deposition. Ion implantation refers to the implantation of ions, for example, for doping a semiconductor substrate. Salicidation means formation of self-aligned silicide.

Electronic element refers to active electronic devices and passive component parts. Electrical conductor refers to a material which readily conducts electricity and includes metals, p-type material (semiconductor material that has been doped with an acceptor-type impurity and conducts current via hole migration), and n-type material (semiconductor material that has been doped with a donor-type impurity and conducts a current via electrons).

Oxide as used in the subject invention refers to silicon oxides and nitride as used herein refers to silicon nitride. The oxide may be doped or undoped, such as PSG (phosphosilicate glass) or BPSG (Boron doped PSG). An insulation layer or insulator layer refers to a layer having a high resistivity, which does not conduct electricity. It may act as a sodium barrier. For the purposes of the present invention, the insulation layer must be capable of being selectively etched to nitride.

The objects discussed above are achieved and the problems of the prior art overcome by the present invention which encompasses in one respect a method of electrically connecting a first electronic element and a second electronic element, when the first and second elements are separated by a dielectric. The method may comprise:

applying a nitride layer over the device;

applying a first insulation layer over the nitride layer;

etching an aperture over the first and second elements by application of a highly selective etch that preferentially etches the insulation layer relative to the nitride layer and application of a selective nitride etch that preferably etches the nitride layer relative to the dielectric layer, thereby forming a first hole through the first insulation layer and the nitride layer; and depositing an electrical conductor in the first hole, thereby forming a strap such that the first and second electrical elements are electrically connected.

The method disclosed above may also be integrated with the formation of a contact within the semiconductor device, which further comprises:

etching an aperture over a third electronic element by application of a highly selective etch that preferentially etches the first insulation layer relative to the nitride layer and application of a selective nitride etch that preferentially etches nitride relative to the underlying material, thereby forming a second hole through the first insulation layer and the nitride layer; and depositing an electrical conductor in the second hole, thereby forming a contact.

The method of the present invention may be readily adapted to and integrated with electrically connecting a trench capacitor and a diffusion within a semiconductor device and electrically connecting additional electronic elements with metal lines, such an application may comprise:

forming an oxide cap over the trench capacitor;

applying a nitride layer over the device;

applying a first insulation layer over the nitride layer;

exposing the trench capacitor and the diffusion by application of a highly selective etch that preferentially etches the first insulation layer relative to the nitride layer, application of a selective nitride:oxide etch, and application of a selective oxide:silicon etch, wherein a first hole is formed exposing the trench capacitor and the diffusion;

depositing an electrical conductor in said first hole, thereby forming a strap and electrically connecting said trench capacitor and said diffusion;

depositing a second insulation layer over the device;

exposing a third electronic element by application of a highly selective etch that preferentially etches said first and second insulation layers relative to said nitride layer and application of a selective nitride etch, thereby forming a second hole;

depositing an electrical conductor in the second hole, thereby forming a contact; and electrically connecting the contact with a metal line wherein the third electronic element is electrically connected with the metal line.

The present invention may also be adapted as a method of electrically connecting a first electronic element with external circuitry, comprising:

applying a nitride layer over a first electronic element;

applying an oxide layer over the nitride layer;

etching an aperture over the first electronic element by application of a highly selective oxide:nitride etch and then a selective nitride etch, thereby forming a first hole through said nitride layer and said insulation layer;

depositing an electrical conductor in said first hole, thereby forming a first contact; and forming external circuitry in electrical contact with said first contact, wherein said first electronic element is electrically connected to said external circuitry.

Figure 2:
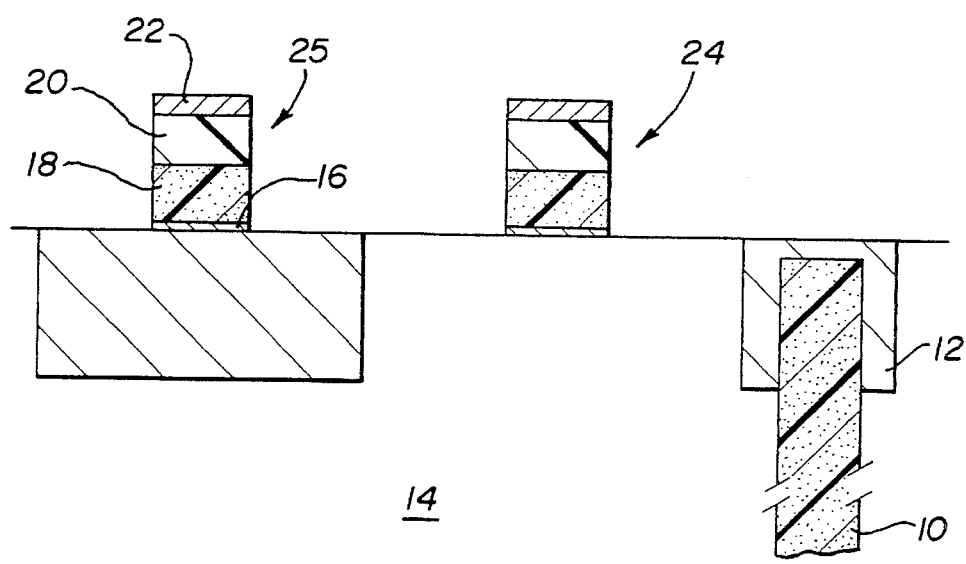
FIG. 2 is a cross sectional view of the structure from FIG. 1 after the plurality of layers have been defined to form gate stacks.

In one embodiment, the first electronic element comprises a polysilicon-filled trench and the second electronic element comprises a diffusion region. As may be seen in FIG. 1, as part of a DRAM cell, the polysilicon filled trench 10 is acting as a trench capacitor and, thus, in order to avoid contact with the diffusions and shorting of the device, the trench has a silicon-oxide collar 12 surrounding the trench near the surface of the silicon substrate 14. The trench and its corresponding collar may be formed during standard CMOS fabrication techniques well known in the art. During fabrication of a CMOS the desired gate stacks may likewise be fabricated by means well known in the art. In the present embodiment the stacks may be formed by depositing upon the semiconductor device the layers which will make up the gate stack. A typical stack may include a layer of gate oxide 16, above which is an conductor such as polysilicon 18 and a metal 20, an example being tungsten silicide ($WSi_x$). An additional layer may be deposited upon the metal to act as a cap 22. The cap may comprise either an oxide or a nitride, the selection of which will depend on the desired process sequences and integration considerations discussed more thoroughly hereinbelow. Once the desired layers have been deposited, the gate stacks 24 and 25 may be defined, as shown in FIG. 2, by standard masking and etching processes, such as by known reactive ion etching (RIE) processes.

Figure 3:
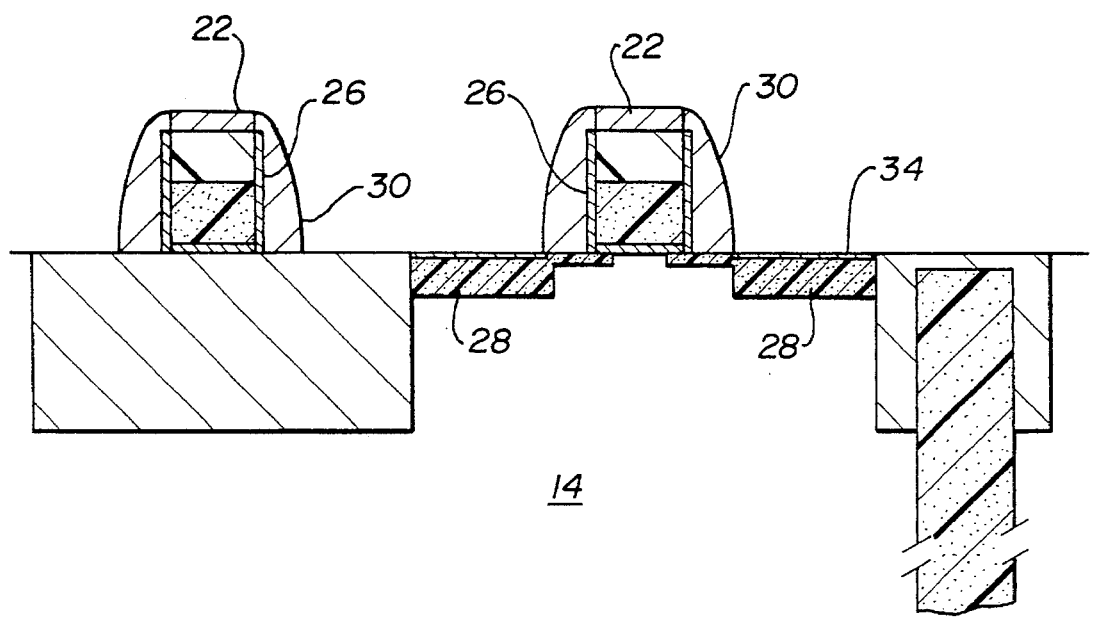
FIG. 3 is a cross sectional view of the structure from FIG. 2 after source/drain implants have been created and spacers added to the gate stacks.

As may best be seen in FIG. 3, after defining the gate stacks 24 and 25, a thin layer 26 of oxide may be grown on the side walls of the gate stacks. The oxide may be grown by means well known in the art, although preferably they are thermally grown, such as by exposing the substrate and the gate stacks to an oxygen-containing atmosphere at temperatures between 800° and 1000° C. This is done in order to protect the materials comprising the gate stack from being damaged in subsequent steps and also to help repair any damage experienced while defining the stacks. Thereafter, the source/drain implants 28 are formed. Preferably only a shallow implant is initially formed in the silicon 14 prior to formation of spacers 30 along the sides of the gate stacks 24. Creation of these shallow implants may include implanting a p-type dopant into the silicon, an example may be ion implantation of boron into the silicon using $BF_2$ followed by a high temperature annealing process. Arsenic or phosphorus is typically employed for n-type regions.

Spacers 30 may then be formed adjacent to the gate stacks and may comprise either a layer of oxide or nitride. The spacers may be formed by depositing the selected layer over the device, an example being by LPCVD, and then using a corresponding etch to define the spacers. Selection of the spacer composition, as with the cap, will ultimately depend upon the desired process sequences and integration considerations discussed in greater detail hereinbelow. Upon completion of the spacers, a deeper implant may be established. Titanium may then be deposited and salicidation of the exposed implants may be effected thereby forming a thin layer of titanium silicide 34.

Figure 4:
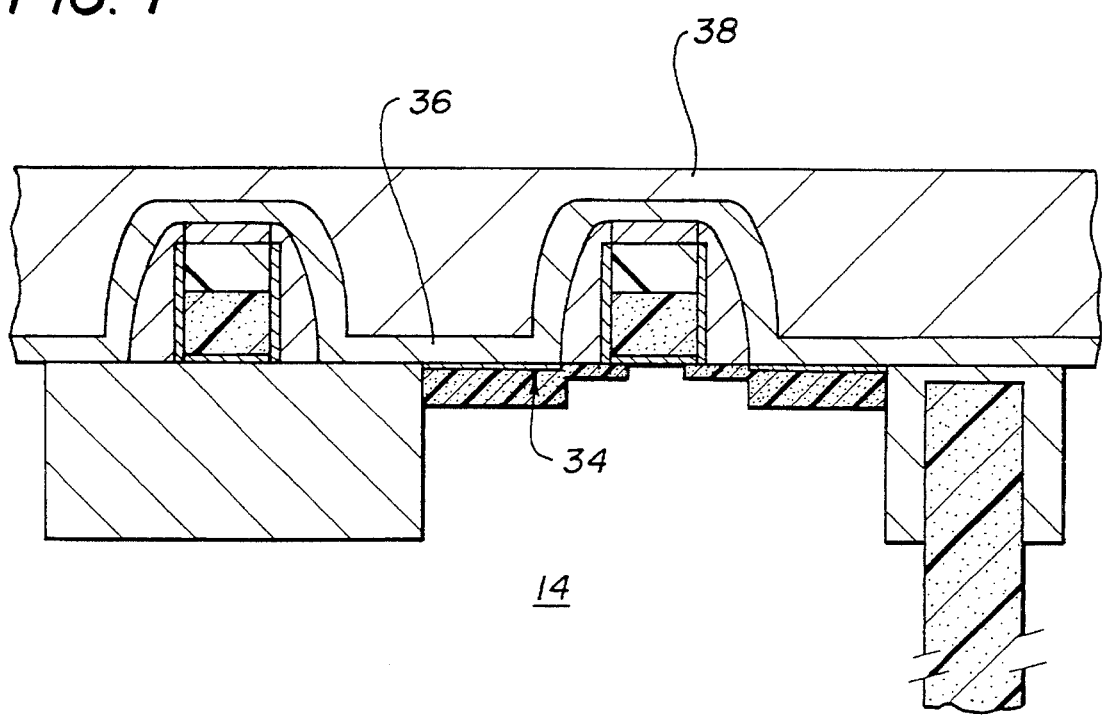
FIG. 4 is a cross sectional view of the structure from FIG. 3 after silicidation of the implants and application of a nitride layer and an insulating layer.

Upon completion and activation of the implants or other desired structures, a layer of nitride 36 may be conformably deposited upon the device as may be seen in reference to FIG. 4. This nitride layer will subsequently act as an etch stop. In the present embodiment, when utilizing nitride caps and nitride spacers, a nitride layer of approximately 50 nm is sufficient to effectively isolate existing structures from contamination or damage by future processing steps. The nitride layer may be deposited by means well known in the art, an example being by plasma enhanced chemical vapor deposition (PECVD). Thereafter an insulation layer 38 may be deposited, chemical mechanical polished, and planarized. Standard insulating materials, an example being silicon oxides such as phosphosilicate glass (PSG), may be utilized to form the insulation layer 38. An important characteristic of the insulation layer is that it be capable of being selectively etched to nitride.

Figure 5:
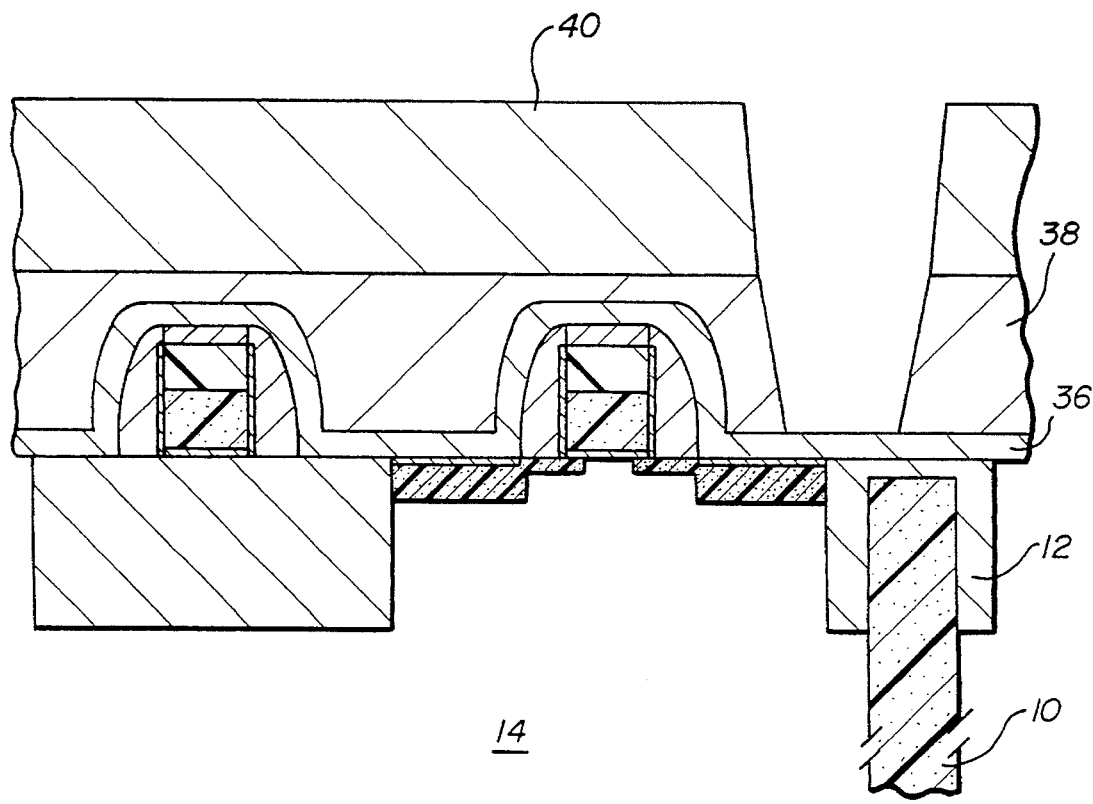
FIG. 5 is a cross sectional view of the structure from FIG. 4 after application of a resist layer and etching to the nitride layer in proximity of the polysilicon trench.

As may best be seen in FIG. 5, a mask 40, such as a photoresist, may then be applied over the insulation layer to expose only that portion of the insulation layer 38 relative to the polysilicon trench 10 and the diffusion region closest to the trench. Formation of a strap hole may then be initiated by applying a highly selective oxide:nitride etch to remove the exposed portion of the insulation layer 38. However, it is important to apply an oxide:nitride etch having a selectivity ratio of at least 12:1 since etches which do not have this high selectivity ratio are likely to cause damage to existing structures, such as the gate stack in the present example. This highly selective oxide:nitride etch removes the exposed portion of the insulation layer and exposes a section of the nitride layer relative to the polysilicon trench and diffusion region.

An example of such a selective etch, having the appropriate oxide:nitride selectivity ratio, is described in the article *Selective Dry Etching In a High Density Plasma for 0.5 μm Complementary Metal-Oxide-Semiconductor Technology, J. Vac. Sci. Technol. B.* Vol. 12, No.1, Jan/Feb 1994, the contents of which are incorporated herein by reference. This selective oxide:nitride etch utilizes a heated silicon top plate and a high C:F ratio fluorocarbon in a high density plasma reactor. Examples of such fluorocarbons include, but are not limited to $C_2F_6$. The preferred selective oxide:nitride etch has a high selectivity ratio, well above 12:1, and comprises a dry etch process.

Figure 6:
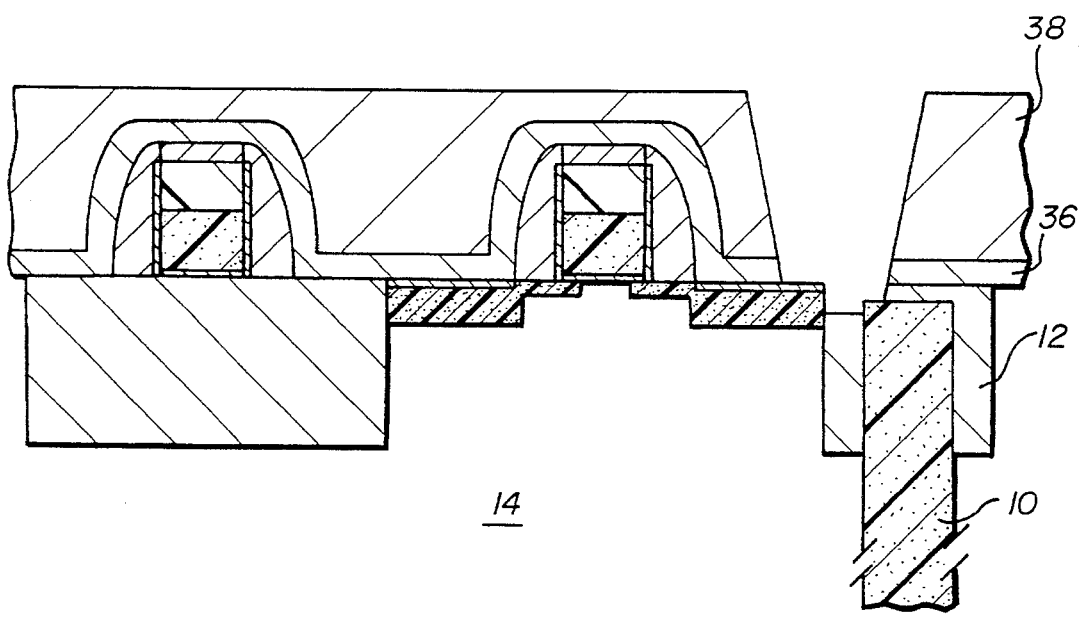
FIG. 6 is a cross sectional view of the structure from FIG. 5 after the polysilicon trench has been exposed.

As may best be seen in FIG. 6, a selective nitride:oxide etch may then be applied to the exposed nitride layer 36 which etches down to the silicon oxide cap 12 of the polysilicon trench 10 and the silicide 34 of the diffusion. Preferably a highly selective nitride:oxide etch, such as the high density plasma selective etch described in the article referenced above, is utilized since a higher selectivity ratio will reduce damage to existing structures. However, unlike the previous step, it is not critical to utilize a highly selective etch to remove the nitride layer. Thus, standard nitride:oxide etches may be utilized, such as those employing $CHF_3/O_2$ chemistry. Once the exposed portion of the nitride layer 36 has been removed, the newly exposed portion of the silicon oxide collar 12 may be removed by applying a selective oxide:(silicon, $TiSi_x$) etch, thereby exposing the polysilicon trench and completing the strap hole. The selective oxide-:(silicon, $TiSi_x$) etch may be applied positionally or across the device in order to remove the mask. An example of such a selective etch is the high density plasma etch described hereinabove.

Positive ions and minor physical damage may be generated during the etching processes and, thus, it is preferable to perform a surface state/damage anneal prior to formation of the plug strap. An example of such an anneal may be heating the device at 600° C. for 30 minutes. This will help prevent trapping of charges and formation of unwanted passivation states.

Figure 7:
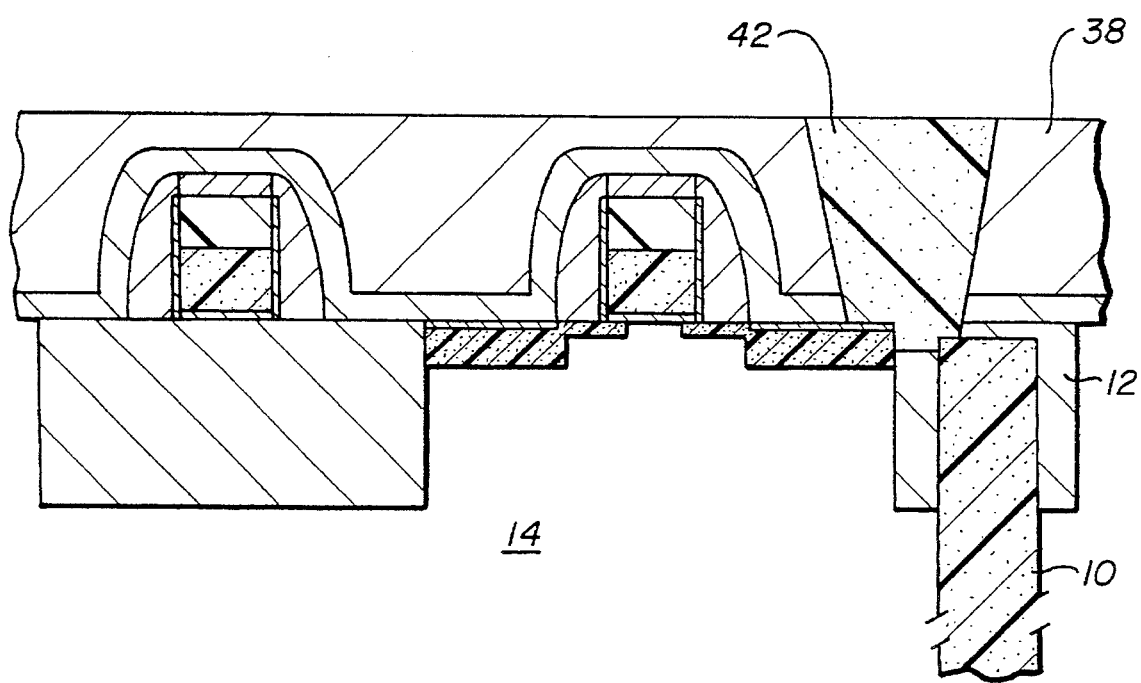
FIG. 7 is a cross sectional view of the structure from FIG. 6 after deposition and planarization of polysilicon in the strap hole.

As shown in FIG. 7, once the strap hole is completed an electrically conductive material, such as p+ polysilicon, may be deposited therein by means well known in the art, an example being LPCVD. Deposition of the p+ polysilicon forms a strap 42 which electrically connects the trench capacitor and the diffusion. However, in the particular embodiment discussed it is preferred that a metal is not utilized in the strap hole exposing the polysilicon trench since it may contact the lightly doped area of the trench and the side wall of the device. Excess p+ polysilicon may be removed and the strap planarized by chemical mechanical polishing, reactive ion etching (RIE), dry etch or other means known in the art.

Figure 8:
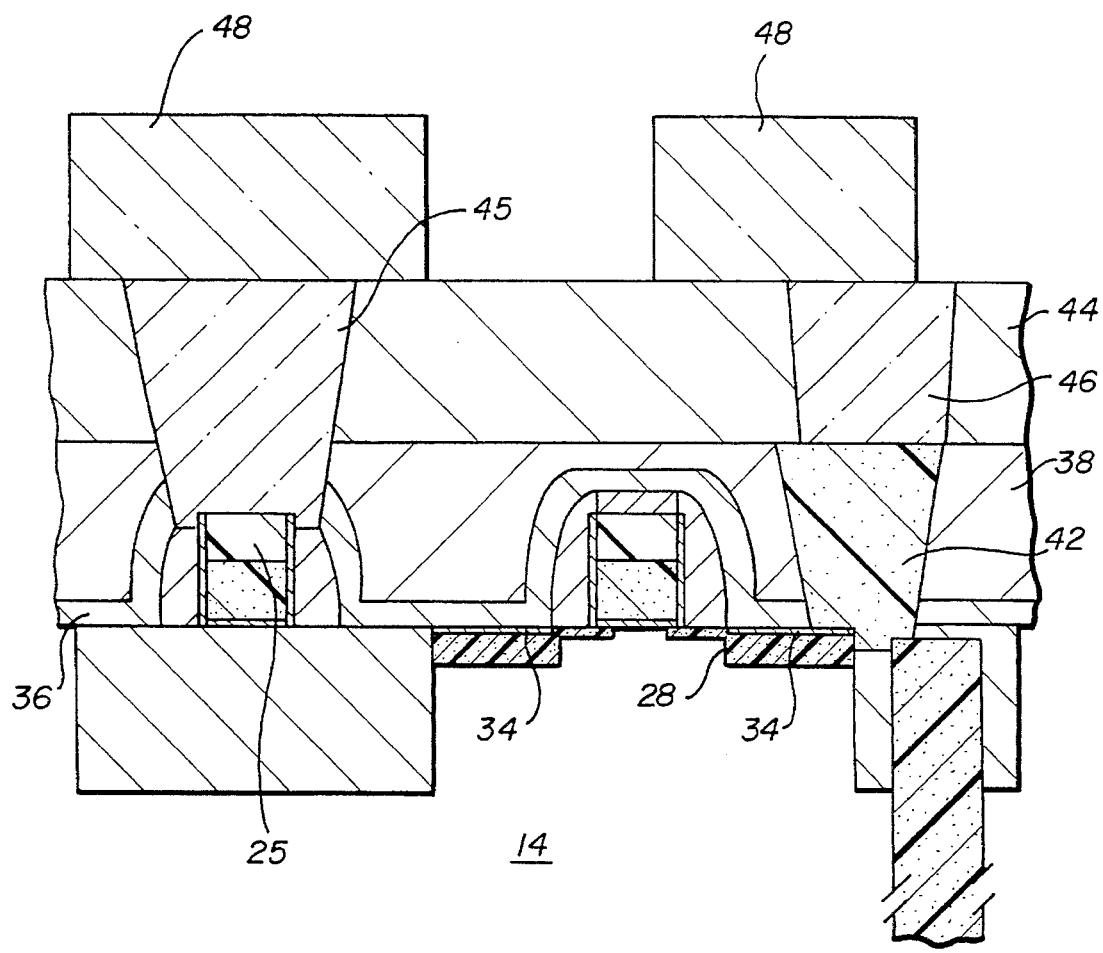
FIG. 8 is a cross sectional view of the structure from FIG. 7 after exposing the gate stack and electrically connecting the gate stacks to external circuitry crossing straps with the bit line.

In reference to FIG. 8, an additional insulation layer 44 may be deposited upon the existing insulation layer 38 and the strap 42. This second insulation layer 44 may comprise an oxide or other like material. As with the first insulation layer 38, the second insulation layer should also be capable of selective etching to nitride. In this particular embodiment, in order to electrically connect the strap 42 to a metal line 48 and the external circuitry of the device, the second insulation layer may be masked and etched using a standard oxide etch in order to remove a portion of the second insulation layer relative to the strap 42. The use of a mask and a highly selective oxide etch may likewise be used to expose the nitride layer 36 encapsulating the selected gate stack or word line. The exposed portion of the nitride etch stop above the gate stack 25 may be etched, as above, using a selective nitride:oxide etch. In the event the cap is also a nitride, application of the nitride:oxide etch may be used to expose the gate stack. Alternatively, when an oxide cap is utilized, after exposing the cap with the selective nitride:oxide etch the highly selective oxide:nitride etch should again be applied to remove the oxide cap and expose the gate stack.

Once the strap 42 and the desired gate stack 25 are exposed an electrical conductor, an example being tungsten, may be deposited within the holes thereby forming contacts 46 to the selected gate stack 25 and the strap 42 and diffusion. Excess metal may then be removed and planarized by chemical mechanical polishing or other means known in the art. Metal lines 48, such as in BEOL metallization, may then be applied to the device thereby forming external circuitry of the device which is in electrical connection with the contacts 46. Preferably the metal lines comprise aluminum or other like metal.

As indicated above, the present invention may utilize caps 22 and spacers 30 comprising either oxide or nitride. Selection of a particular combination will ultimately depend upon the desired process sequences and integration considerations such as device capacitance, thickness of the nitride etch stop (which is limited by the minimum space between gate stacks) and the types of contacts (namely, borderless or bordered). Use of an oxide cap and an oxide spacer will help provide the smallest plug strap process window but integrates well with a borderless to diffusion contact process. However, use of an oxide cap and an oxide spacer may require use of a thicker nitride etch stop layer. Conversely, when using a nitride cap and a nitride spacer a thinner nitride etch stop layer may be used which generally results in a larger plug strap process window. Thus, nitride cap and a nitride spacer does provide the most robust and reliable process.

Figure 9:
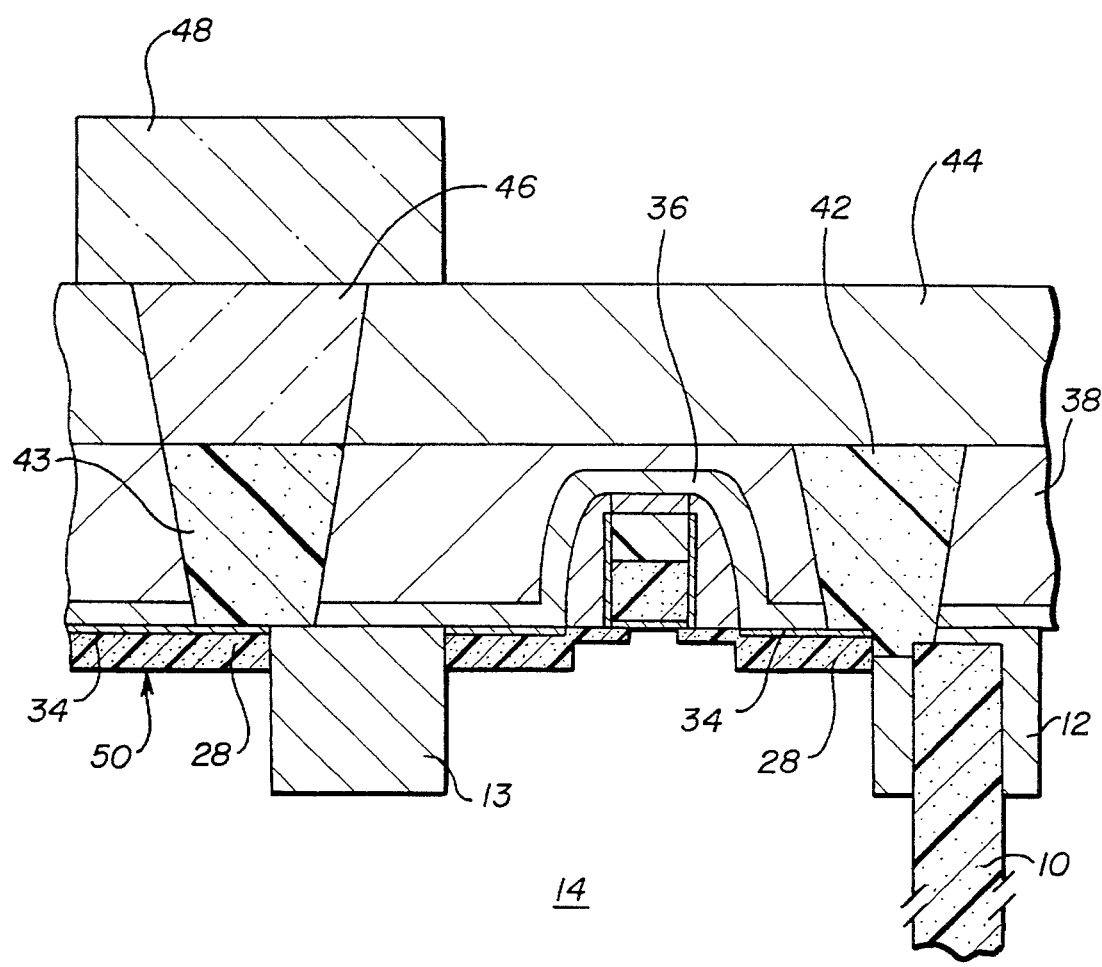
FIG. 9 is a cross-sectional view of a semiconductor device having a borderless to diffusion contact.

It will be understood by those skilled in the art that the present method of strap formation may be adapted to any one of numerous applications as well as integrated with the formation or electrical connection of other structures. For example, FIG. 9 shows a semiconductor device having a borderless to diffusion contact wherein any one of numerous electronic elements (not shown) may in turn be positioned in contact with the diffusion region. The polysilicon trench 10 may be exposed and the strap 42 created in accordance with the process discussed hereinabove. Prior to forming the second insulation layer 44, the first insulation layer 38 relative to the isolation trench 13 and second diffusion region 50 may be etched, exposing a section of the nitride layer 36, through use of a mask and application of a highly selective oxide:nitride etch. Application of a selective nitride:oxide etch will then further extend this second hole through the exposed nitride layer thereby exposing the isolation trench 13 and the silicide 34 of the second diffusion region. An electrical conductor, such as p+ polysilicon, may then be deposited within the second hole exposing the isolation trench 13 and second diffusion, thereby forming a contact 43. After removal of excess material and planarization of the contact 43, a second insulation layer 44 may then be deposited over the device. The contact 43 may then be exposed, using a mask and a standard oxide etch. An electrical conductor, such as tungsten, may be deposited within the hole exposing contact 43 thereby forming a second contact 46. Excess metal may be removed and contact 46 planarized, a metal line 48 may then be deposited over the second contact 46 thereby placing the second diffusion region in electrical contact with the external circuitry of the device.

Figure 10:
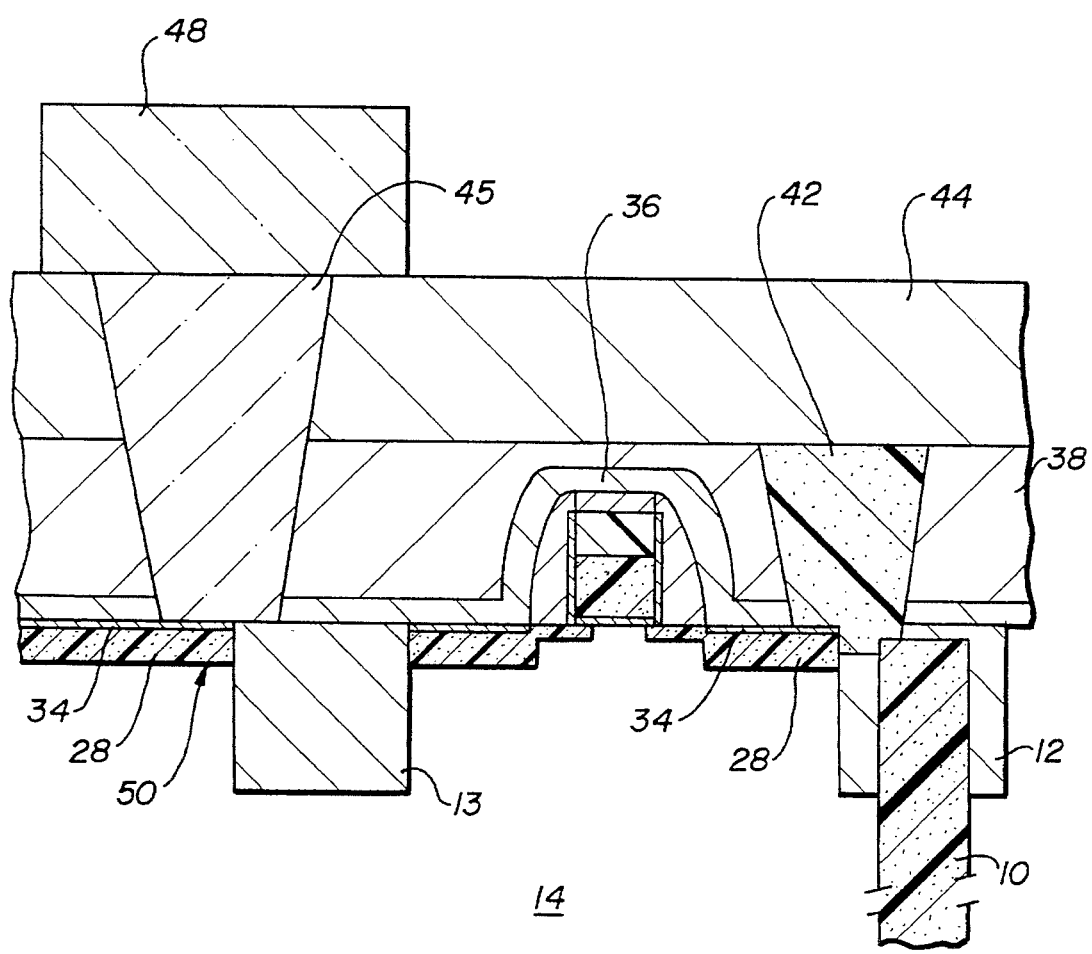
FIG. 10 is a cross-sectional view of a semiconductor device having a borderless to diffusion contact.

Alternatively, as may be seen in FIG. 10, the diffusion may be electrically connected to the external circuitry by formation of a single contact 45. After formation of the first strap 42 and deposition of the second insulation layer 44, as described hereinabove in reference to FIGS. 1–6, the first and second insulation layers relative to the unlanded diffusion region 50 and isolation trench 13 are removed by standard masking techniques and application of a highly selective oxide:nitride etch. This application exposes a section of the nitride layer 36 relative to the isolation trench and the second diffusion. Then a selective nitride:oxide etch is applied removing the exposed nitride layer and exposing the isolation trench and second diffusion region. An electrical conductor, such as tungsten, may then be deposited in the corresponding hole and planarized thereby forming contact 45. Thereafter, formation of the metal lines 48 in electrical connection with contact 45 places the second diffusion in electrical contact with the external circuitry of the device.

While the present invention has been particularly shown and described with reference to preferred embodiments thereof, it will be understood to those skilled in the art that various changes in form and details may be made therein without departing from the spirit and the scope of the invention.

What is claimed is:

1. A method of electrically connecting a first electronic element and a second electronic element separated by a dielectric, comprising:

applying a nitride layer over both of said elements and said dielectric;

applying a first insulation layer over said nitride layer;

etching an aperture over said first and second elements by application of a highly selective etch that preferentially etches said insulation layer relative to the nitride layer and application of a selective nitride etch that preferably etches said nitride layer relative to said dielectric layer, thereby forming a first hole through said first insulation layer and said nitride layer; and depositing an electrical conductor in said first hole, thereby forming a strap wherein said first and second electrical elements are electrically connected.

2. A method of claim 1 wherein said insulation layer comprises a silicon oxide.

3. The method of claim 1 further comprising:

planarizing the strap; and depositing a second insulation layer over said first insulation layer and said strap.

4. A method of electrically connecting a first electronic element and a second electronic element, separated by a dielectric, comprising:

applying a nitride layer over both of said elements and said dielectric;

applying a first insulation layer over said layer;

etching an aperture over said first and second elements by application of a highly selective etch that preferentially etches said first insulation layer relative to said nitride layer, application of a selective nitride etch that preferentially etches said nitride layer relative to said dielectric, and a highly selective etch that preferentially etches said dielectric relative to silicon, thereby forming a first hole through said first insulation layer, said nitride layer and said dielectric;

depositing an electrical conductor in said first hole, thereby forming a strap wherein said first and second electrical elements are electrically connected.

5. The method of claim 4 wherein said insulation layer comprises a silicon oxide.

6. The method of claim 5 wherein said highly selective etch that preferentially etches said insulation layer relative to the nitride layer comprises an oxide:nitride etch having a selectivity ratio of at least 12:1.

7. The method of claim 6 wherein said highly selective oxide:nitride etch comprises a dry etch utilizing a high C:F ratio fluorocarbon in a high density plasma reactor.

8. The method of claim 6 wherein said dielectric comprises an oxide and said highly selective etch that preferentially etches said dielectric relative to silicon comprises a highly selective oxide:silicon etch.

9. The method of claim 4 further comprising:

planarizing the strap; and depositing a second insulation layer over said first insulation layer and said strap.

10. The method of claim 4 wherein said dielectric covers said first element.

11. An integrated method of forming a strap and a contact within a semiconductor device, comprising:

forming a strap in accordance with the method of claim 4;

etching an aperture over a third electronic element by application of a highly selective etch that preferentially etches said first insulation layer relative to said nitride layer and application of a selective nitride etch, thereby forming a second hole through said first insulation layer and said nitride layer;

depositing an electrical conductor in said second hole, thereby forming a contact.

12. The integrated method of claim 11 further comprising:

depositing a second insulation layer over said device;

etching an aperture over said contact thereby forming a third hole;

depositing an electrical conductor in said third hole;

planarizing said electrical conductor deposited in said third hole; and forming a metal line physically touching said electrical conductor in said third hole.

13. The method of claim 12 wherein said strap is planarized prior to depositing a second insulation layer over said device.

14. The method of claim 12 wherein said contact is planarized prior to depositing a second insulation layer over said device.

15. An integrated method of forming a strap and a contact in a semiconductor device, comprising:

forming a strap in accordance with claim 9;

etching an aperture over a third electronic element by alternating application of a highly selective etch that preferentially etches said insulation layer relative to said nitride layer and application of a selective nitride etch, thereby forming a second hole extending through said second insulation layer, said first insulation layer and said nitride layer;

depositing an electrical conductor in said second hole, thereby forming a contact;

electrically connecting said contact and a metal line.

16. A method of claim 15 wherein electrically connecting said contact and metal line comprises:

planarizing said contact; and forming a metal line physically touching said contact.

17. A method of electrically connecting a trench capacitor and a diffusion within a semiconductor device, comprising:

forming an oxide cap over said trench capacitor;

applying a nitride layer over said device;

applying a first insulation layer over said nitride layer;

exposing said trench capacitor and said diffusion by application of a highly selective etch that preferentially etches said insulation layer relative to said nitride layer, application of a selective nitride:oxide etch, and application of a selective oxide:silicon etch, wherein a first hole is formed exposing said trench capacitor and said diffusion;

depositing an electrical conductor in said first hole, thereby forming a strap and electrically connecting said trench capacitor and said diffusion.

18. The method of claim 17 wherein said insulation layer comprises a silicon oxide and said highly selective etch that preferentially etches said insulation layer relative to said nitride layer comprises a highly selective oxide:nitride etch.

19. The method of claim 17 wherein said insulation layer comprises doped silicon oxide.

20. The method of claim 17 wherein said insulation comprises phosphorous doped silicon oxide.

21. The method of claim 18 wherein said highly selective oxide:nitride etch comprises a dry etch utilizing a high C:F ratio fluorocarbon in a high density plasma reactor.

22. The method of claim 17 further comprising:

planarizing said strap; and applying a second insulation layer over said first insulation layer and said strap.

23. The method of claim 17 wherein said device has at least one gate stack having a cap and a spacer, the cap and spacer comprising compounds selected from the group of oxide and nitride.

24. The method of claim 23 wherein said cap comprises nitride.

25. The method of claim 23 wherein said cap and said spacer both comprise nitride.

26. The method of claim 17 wherein said electrical conductor comprises p+ silicon.

27. An integrated method of forming a strap and a contact in a semiconductor device having a diffusion, a trench capacitor and a third electronic element, comprising:

forming a strap in accordance with the method of claim 17;

exposing said third electronic element by application of a highly selective etch that preferentially etches said insulation layer relative to said nitride layer and application of a selective nitride etch, thereby forming a second hole over said third electronic element;

depositing an electrical conductor in said second hole, thereby forming a contact;

depositing a second insulation layer over said device;

exposing said contact; and electrically connecting said contact with a metal line thereby placing said third electronic element in electrical contact with said metal line.

28. The method of claim 27 wherein said strap and said contact are planarized prior to depositing said second insulation layer.

29. An integrated method of forming a strap and contact in a semiconductor device having a diffusion, a trench capacitor and a third electronic element, comprising:

forming a strap in accordance with the method of claim 22;

exposing the third electronic element by application of a highly selective etch that preferentially etches said first and second insulation layers relative to said nitride layer and application of a selective nitride etch, thereby forming a second hole;

depositing an electrical conductor in said second hole, thereby forming a contact;

electrically connecting said contact and a metal line wherein said third electronic element is electrically connected with said metal line.

30. An integrated method of forming a strap and a contact in a semiconductor device having a diffusion, a trench capacitor, and at least one gate stack having a cap and a spacer, comprising:

forming a strap in accordance with the method of claim 24;

depositing a second insulation layer;

exposing a selected gate stack by applying a highly selective etch that preferentially etches said insulation layer relative to said nitride layer, and applying a selective nitride etch, thereby forming a second hole and exposing said selected gate stack;

depositing an electrical conductor in said second hole, thereby forming a contact;

electrically connecting said contact and a metal line, wherein said gate stack and said metal line are electrically connected.

31. An integrated method of forming a strap and a contact in a semiconductor device having a diffusion, a trench capacitor, and at least one gate stack having a cap and a spacer, comprising:

forming a strap in accordance with the method of claim 23, wherein said cap comprises an oxide;

depositing a second insulation layer;

exposing a selected gate stack by applying a highly selective etch that preferentially etches said insulation layer relative to said nitride layer, and applying a selective nitride:oxide etch and then applying a selective oxide:nitride etch, thereby forming a second hole and exposing said selected gate stack;

depositing an electrical conductor in said second hole, thereby forming a contact;

electrically connecting said contact and a metal line, wherein said gate stack and said metal line are electrically connected.

* * * * *